(12) United States Patent
O'Brien et al.

(10) Patent No.: US 8,779,637 B2
(45) Date of Patent: Jul. 15, 2014

(54) MAGNETIC ACTUATION METHOD

(75) Inventors: Daniel O'Brien, Sunnyvale, CA (US); Jérôme Delamare, Grenoble (FR); Orphée Cugat, Poisat (FR); Olivier Geoffroy, Saint-Martin-d'Hères (FR)

(73) Assignees: Institut Polytechnique de Grenoble, Grenoble (FR); Centre National de la Recherche Scientifique, Paris Cedex (FR)

( * ) Notice: Subject to any disclaimer, the term of this patent is extended or adjusted under 35 U.S.C. 154(b) by 407 days.

(21) Appl. No.: 13/125,589

(22) PCT Filed: Oct. 23, 2009

(86) PCT No.: PCT/FR2009/052046
§ 371 (c)(1),
(2), (4) Date: Jun. 16, 2011

(87) PCT Pub. No.: WO2010/046614
PCT Pub. Date: Apr. 29, 2010

(65) Prior Publication Data
US 2011/0248581 A1    Oct. 13, 2011

(30) Foreign Application Priority Data
Oct. 24, 2008   (FR) ...................... 08 57257

(51) Int. Cl.
*H02K 37/00*   (2006.01)
*H01L 41/00*   (2013.01)
*H01L 41/06*   (2006.01)
*H01L 41/09*   (2006.01)
*H01L 41/12*   (2006.01)
*H02K 37/10*   (2006.01)

(52) U.S. Cl.
CPC ................ *H01L 41/06* (2013.01); *H01L 41/00* (2013.01); *H01L 41/09* (2013.01); *H01L 41/12* (2013.01); *H02K 37/00* (2013.01); *H02K 37/10* (2013.01)
USPC ............ 310/26; 310/46; 310/211; 310/313 A; 310/323.01; 310/323.02

(58) Field of Classification Search
CPC ......... H01L 41/00; H01L 41/09; H01L 41/12; H01L 41/06; H02K 37/00; H02K 37/10
See application file for complete search history.

(56) References Cited

U.S. PATENT DOCUMENTS 6,483,741 B1 * 11/2002 Iwasaki et al. ................ 365/170
6,515,382 B1 *  2/2003 Ullakko ......................... 310/26

(Continued)

FOREIGN PATENT DOCUMENTS

WO        98/44572        10/1998

OTHER PUBLICATIONS

Hu et al, "Micromagnetic modeling studies on the effects of stress on magnetization reversal and dynamic hysteresis", JMMM, 2006.*
Toshiyuki Ueno et al., "Linear Step Motor . . . and Piezoelectric Materials", IEEE Transacting on Magnetics, IEEE Service Center, New York, NY, US, vol. 43, No. 1, Jan. 1, 2007, pp. 11-14.

*Primary Examiner* — John K Kim
(74) *Attorney, Agent, or Firm* — Clark & Brody

(57) ABSTRACT

The present invention relates to a magnetic actuation method according to which a magnetized mobile (4) is directed by means of at least one magnetic element (2, 2a, 2b) placed opposite said magnetized mobile, characterized in that the preferred direction (or easy axis) of magnetization is made to turn at every point of said element by applying at least one mechanical constraint to said magnetic element(s) (2, 2, 2b), causing anisotropy within said element and thus moving the magnetized mobile in a preferred linear direction or causing the same to rotate.

8 Claims, 5 Drawing Sheets

(56) References Cited

U.S. PATENT DOCUMENTS

| | | |
|---|---|---|
| 6,640,652 B2* | 11/2003 | Kikuchi et al. .......... 73/862.333 |
| 6,984,902 B1* | 1/2006 | Huang et al. .................... 310/26 |
| 7,573,172 B2* | 8/2009 | Maeda .......................... 310/191 |
| 2003/0103371 A1* | 6/2003 | Kim et al. ..................... 365/145 |
| 2006/0153976 A1* | 7/2006 | Ito et al. ........................ 427/127 |
| 2007/0145833 A1* | 6/2007 | Or et al. .......................... 310/26 |
| 2007/0186666 A1* | 8/2007 | Ruehrig et al. ................. 73/779 |
| 2009/0016098 A1* | 1/2009 | Wunderlich et al. .......... 365/158 |
| 2011/0248581 A1* | 10/2011 | O'brien et al. .................. 310/46 |

* cited by examiner

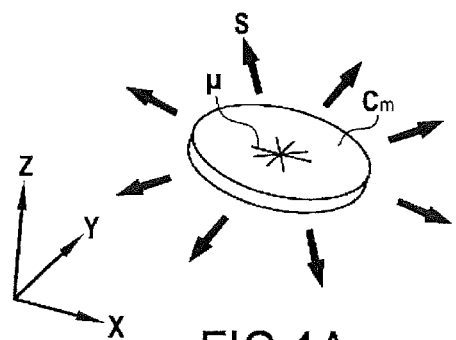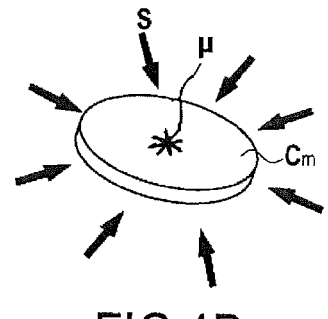
FIG.1A   FIG.1B
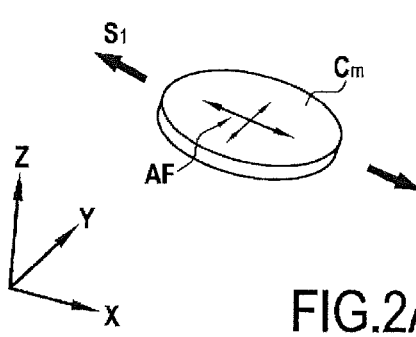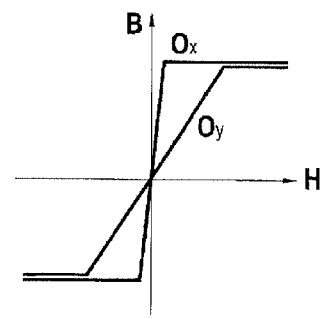
FIG.2A
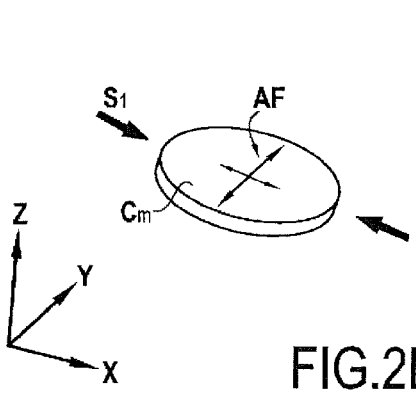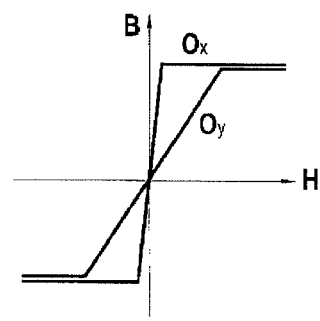
FIG.2B

MAGNETIC ACTUATION METHOD

The present invention relates to the field of magnetic actuators, particularly for micro- and nanotechnologies.

The invention relates more particularly to a magnetic actuation method and device requiring no high electrical current or electrical winding.

Magnetic actuation of systems is currently used and prized in industry and research because magnetic interactions offer high energy densities and excellent converting efficiency between mechanical and electrical energy.

Such magnetic actuation traditionally requires the use of more or less high electrical currents within conductors and/or windings interacting with permanent magnets and/or soft magnetic materials, or even with other conductors. Circulation of these electrical currents in these conductors, however, generates heating and Joule effect losses, which reduce the efficiency of systems and, in the case of on-board or transportable systems, also reduce the endurance of electrical energy sources.

Moreover, in small size systems such as micro- or nanosystems, the heating resulting from the Joule effect losses can cause deterioration of the components, even their destruction, as well as noise in certain cases or applications.

Finally, the circulation of electrical currents can also, particularly when the currents are high, cause demagnetization or a change in magnetization of certain permanent magnets within the systems, disturbing their operation.

Patent application WO 98/44572 A1 and the article by UENO et al: "Linear step motor based on magnetic force control using composite of magnetostrictive and piezoelectric materials," *IEEE Transactions on Magnetics*, IEEE Service Center, New York, N.Y., USA, vol. 43, No I, 1 Jan. 2007, describe magnetic actuation methods making use of the possibility of varying the value, which can be called a "scalar" value, of the magnetic permeability of a magnetostrictive material when it is subjected to a mechanical stress in order to obtain motion or actuation. The mechanical stress can be global, over the entire magnetostrictive material, what changes the force of interaction with a magnet set nearby. The stress can also be localized over only a part of the material, which locally affects the value of its permeability and can have the effect of creating an imbalance of the magnetic forces in consideration capable of generating a motion, which can be a rotation. This rotation can be maintained for example by progressively changing the place where the stress is localized, with several piezoelectric actuators in a star configuration for example, or applied to several segments separated by a ring of magnetostrictive material. These techniques are therefore constraining as regards the application of the stresses needed for the initiation and the maintenance of the induced motion.

A first objective of the invention is to propose a new magnetic actuation method which does not suffer from the aforementioned disadvantages of known magnetic actuation methods.

Another objective of the invention is to propose a magnetic actuation method which is very simple and economical to implement.

Another objective of the invention is to propose a magnetic actuation method which can easily be applied to micro- and nanosystems.

These different objectives are attained according to the present invention through a magnetic actuation method by which a magnetized mobile is steered by means of at least one magnetic element facing said magnetized mobile, and wherein the preferred direction (or easy axis) of magnetization throughout said element is spinned round by the application of at least one mechanical stress on said magnetic element(s), causing an anisotropy within said element and thus driving the magnetized mobile in a preferred linear or angular direction.

The method of the invention provides the decisive advantage of allowing actuation of a magnetized mobile without magnetic force generated by means of an electrical current, thus allowing the elimination of the major problems associated with these currents, particularly consumption, Joule effect thermal losses and their associated disadvantages.

Moreover, the method of the invention has the advantage of being implementable through multiple modalities of application of the mechanical stress on the magnetic element, which eases adapting the actuation method depending on dedicated applications and the sizing of systems in which the method is used.

The present invention fundamentally differs from the prior art by the fact that it makes use, instead of a local or overall permeability value variation of a magnetostrictive material, the intrinsically directional aspect, which can be called "vectorial", of the preferred magnetization direction, also called the easy magnetization axis, of magnetostrictive materials subjected to a unidirectional stress, which can be angularly oriented. In particular, the orientation of this easy magnetization direction can be controlled by the direction and the amplitude of a unidirectional mechanical stress to which the material is subjected.

According to the invention, the magnetic element consists of a soft magnetostrictive material, the easy magnetization axis whereof can turn under a mechanical stress, that is to say a high permeability material, the direction of the easy magnetization axis whereof can be controlled by a mechanical stress.

Still according to the invention, the mechanical stress applied to the magnetic element is a stress that can be oriented or directional, or anisotropic, that is a compression or a tension the principal component whereof is substantially aligned in a very definite direction, the same direction throughout the material.

Moreover, said directional mechanical stress applied to the magnetic element can also result from the application of two directional stresses, preferably applied along two separate intersecting directions substantially 45° apart, particularly depending on the motion that it is desired to impart to the magnetized mobile.

According to one advantageous feature of the method of the invention, the magnetized mobile is held in at least one stable position in the absence of a mechanical stress applied to the at least one magnetic element, the stable position(s) being determined by at least one shape anisotropy of said at least one magnetic element. Preferably, the magnetized mobile is held in several stable positions regularly spaced from one another in the absence of mechanical stress, said stable positions being determined by an identical periodic anisotropy of said at least one magnetic element. Thanks to this ability of the magnetized mobile to hold a position according to the anisotropy of the magnetic material, stepping actuation applications can be considered for implementation using the method of the invention, by sequentially applying the mechanical stress to the magnetic material.

Preferably, according to the process of the invention, the magnetic element consists of at least one thin layer or of at least one element of a soft magnetostrictive material, such as for example the following alloy bases: FeNi, FeCo, FeAl, FeB, FeSiB, FeCoZrNbB, FeCoSmB, FeCoTbB, obtained in amorphous or in crystalline form.

Preferably too, the magnetic element is built onto a substrate, particularly a piezoelectric element, of the multi-fiber composite (MFC) type for example, connected to a direct or alternating voltage generator. The use of piezoelectric substrates to apply the mechanical stress to the magnetic element has proven particularly advantageous. In fact, these materials have the property of deforming relatively little while still undergoing relatively high mechanical loads. Furthermore, losses and leakage currents (statically) in said materials are very small, which makes it possible to considerably reduce the consumption of systems actuated according to the method of the invention. Finally, it is worth noting that the positive connection of the magnetic material to its substrate should be such that the connection between the two elements is such that the stress created by the substrate is properly transmitted to the magnetic element, both in amplitude and in direction. This is the reason why the magnetic element is preferably sprayed, welded or glued onto its support.

Another aspect of the present invention additionally concerns a magnetic actuator configured to implement the method of the invention. Such an actuator is characterized by the fact that it comprises at least one magnetized element mounted so as to be movable with respect to a magnetic element made up of at least one thin layer or of at least one element made of a soft magnetostrictive material the easy magnetization axis whereof can be oriented under a mechanical stress, and also including means for applying at least one mechanical stress to the magnetic element.

According to a preferred embodiment of the actuator of the invention, the stress application means include at least one piezoelectric element, preferably of the multi-fiber composite type, to which the magnetic material is attached.

In one advantageous alternative embodiment of the actuator of the invention, the magnetic element has an anisotropic shape in at least one plane, and preferably an anisotropy of identical periodic shape. Such an anisotropic shape of the magnetic material makes it possible to make, with a crenelated or star-shaped magnetic material for example, a stepping actuator allowing the magnetized mobile to be held in stable positions determined by the anisotropy of the material in the absence of mechanical stresses on said material, by combining the use of the anisotropic shape with sequential electronic control of the mechanical stress application means.

In one alternative embodiment, the magnetic element of the actuator comprises two layers of a magnetic material and the stress application means comprise an electrostatic air gap provided by spacing means arranged between the two layers of magnetic material. In this embodiment, multiple electrodes on either side of the air gap and in a quadrant shape, make it possible for example to apply a substantially unidirectional stress with a variable angular orientation depending on the electrodes that are activated.

Such a magnetic actuator can advantageously constitute a switch, a potentiometer, a motor or a directional indicator.

Various other features are revealed by the description given below with reference to the appended drawings which show, as non-limiting examples, embodiments of the object of the invention.

FIG. 1 shows the effect of an isotropic in-plane constraint on a thin layer or a ribbon of magnetostrictive material on the direction and the intensity of the easy magnetization axis of the said layer or ribbon;

FIG. 2 shows the effect of a uniaxial in-plane constraint on a thin layer or a ribbon of magnetostrictive material and the appearance of an easy magnetization direction in said layer depending on the direction and the orientation of the applied constraint;

The present invention proposes a new magnetic actuation process which does not use electrical currents to create a magnetic force, proposing instead to essentially use the properties of rotation of the easy magnetization axis of certain materials under mechanical stresses to initiate and control the rotary or linear motion of a mobile preferably consisting of a permanent magnet. The method of the invention can also be used to create a "variable" or "steerable" magnetic field within a volume, particularly of a liquid or gas, in which magnetically-sensitive cells or microparticles are floating.

FIG. 1 shows the effect, known in the state of the art, produced by the application of an isotropic stress S on the magnetic permeability □ of a layer Cm of a magnetostrictive material having positive magnetostriction such as for example a layer of iron-silicon-boron (FeSiB). Thus when the stress S corresponds to a tension (1) on the edges of the layer Cm, the permeability □ of the material is greater in the plane of the stress than along the perpendicular axis Oz, with no preferred direction in the Oxy plane except in the event of the geometric shape of the layer inducing a shape effect, or of crystallographic anisotropy thereof. Conversely, when the stress S is an isotropic compression (2) the magnetic permeability □ in the X-Y plane of said layer is reduced.

FIG. 2 shows the emphasis (or the generation), by application of a uniaxial tension (1) and compression (2) stress S1 respectively, of an easy magnetization axis AF in a circular layer Cm of a magnetostrictive material such as iron-silicon-boron (FeSiB) for example.

Thus it can be noted that the orientation of the easy axis AF depends on the stress. In the case of a material with positive magnetostriction, when the applied stress is a tension (1), the easy axis AF is oriented parallel to the axis of the stress. Contrarily, when the stress applied to the layer Cm is a compression (2), the easy axis AF is oriented orthogonally to the axis of said stress. The effects in tension and compression are inverted in the case of a material with negative magnetostriction.

Figure 3:
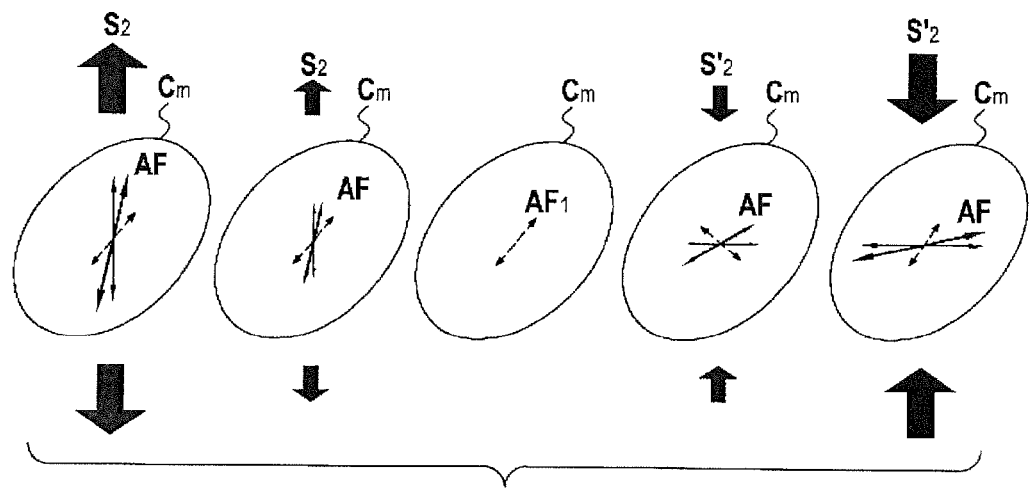
FIG. 3 shows the effect of in-plane rotation of the easy magnetization axis of a thin layer or a non-circular ribbon of magnetostrictive material under a uniaxial constraint.

FIG. 3 shows the ability to rotate the easy magnetization axis AF of a thin layer Cm of magnetostrictive material with a selected anisotropic shape, oval or elliptical in this instance, as a function of the variation of intensity and in orientation of a stress S2 applied in a direction lying between the principal axes of the layer Cm. The form factor of the non-circular geometry of the layer induces a preferred magnetization direction, along the major axis in the present case.

It can be observed here, by observing the sequence shown from left to right in FIG. 3, that the intensity and the orientation of the stress S2 applied to the thin layer Cm in a single direction alter the preferred magnetization direction AF of said layer Cm.

Thus when an increasing tension stress S2 is applied in a direction substantially offset by a certain angle with respect to the easy axis of the layer Cm, the direction of the easy axis AF tends to gradually approach a direction parallel to the direction of the stress, and when on the contrary an increasing compression stress S'2 is applied, still in the same offset direction, the easy axis AF gradually orients itself along a line substantially perpendicular to the direction of application of the stress S'2, thus driving the magnetized mobile in a preferred linear or angular direction.

It is therefore possible, by modulating the sign and the intensity of a single unidirectional stress applied to a layer Cm having shape anisotropy, to continually orient the preferred magnetization direction in the plane of the thin layer Cm. The use of anisotropic shapes of the magnetic material advantageously allows the construction of stepping actuators.

Figure 4:
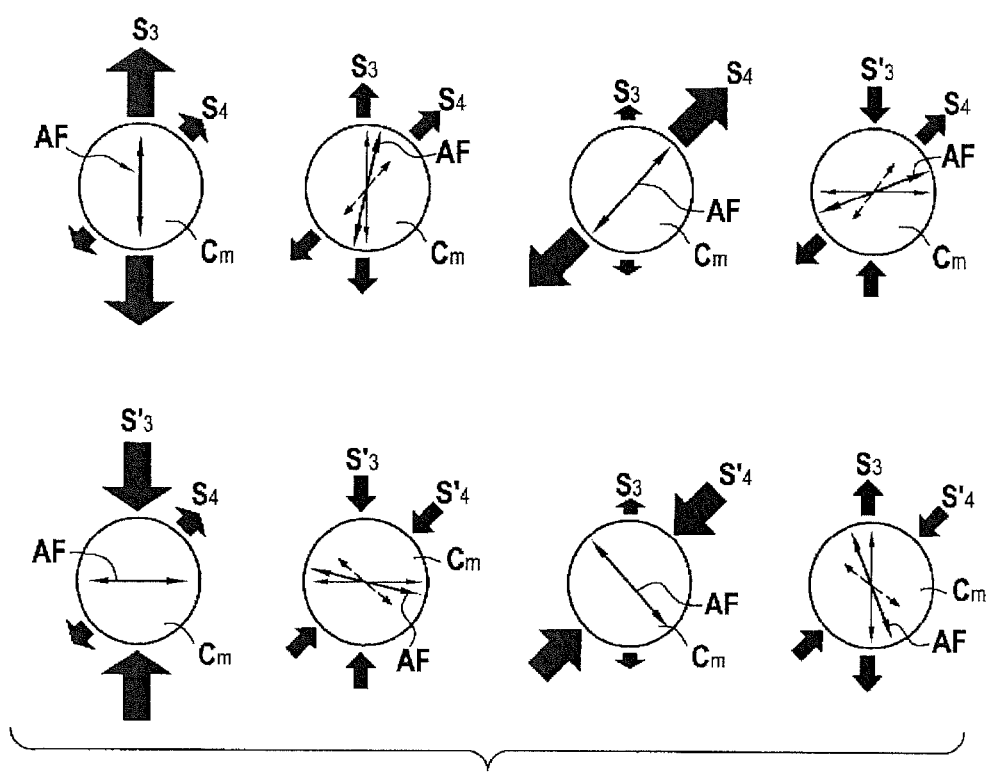
FIG. 4 shows the progressive rotation effect of in-plane rotation of the easy magnetization axis of a thin layer or a ribbon of magnetostrictive material under two independent uniaxial stresses separated by a 45° angle.

FIG. 4 shows the continuous rotation effect of the preferred magnetization direction AF of a thin layer Cm of magnetic material (here the thin layer has circular geometry, is therefore isotropic, and therefore does not naturally possess an easy magnetization direction, unlike the ellipse of FIG. 3 above.). The continuous rotation effect is produced by the combined action of two independent tension or compression stresses S3, S4 or compression stresses S'3, S'4, the axes of application whereof are offset by a 45° angle in the plane of the layer Cm.

As revealed in this FIG. 4, seen from left to right and from top to bottom, the easy axis AF can be oriented in any angular direction in the plane of a layer Cm, by operating on the sign (compression or tension) and the intensity of the two unidirectional stresses S3, S4 and/or S'3, S'4 applied to said layer Cm.

It should also be noted that in the experiment carried out by the inventors, the two stresses applied to the thin layer Cm are sinusoidal in time with a temporal phase shift of 90°, which makes it possible to drive the easy axis in substantially uniform rotation.

The actuation method of the present invention rests on the fact that in certain magnetic materials, like FeSiB in particular, an anisotropy or an easy magnetization axis direction AF can be created and controlled by the effect of mechanical stress. The method of the invention, unlike the prior art technology, does not employ the variation of intensity of the permeability of the material, whether general or local according to whether the stress is applied to the entire material or only locally.

In fact, the interaction between a permanent magnet and soft magnetic material depends particularly on the easy magnetization axis AF of the soft material and on the polarization of the permanent magnet. When the easy axis AF of the magnetic material varies, it is possible to create a force and/or torque imbalance on the permanent magnet, forcing the magnet to move, and in particular to rotate if required. Magnetic actuation is therefore attained which can be employed according to the present invention, of which various examples of practical implementation will be described hereafter with reference to FIGS. 5A through 14.

Figure 5A:
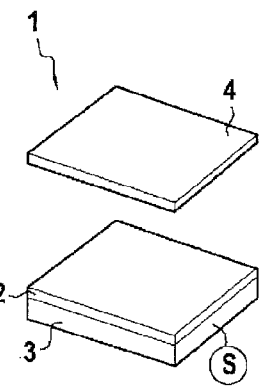
FIGS. 5A through 5C show different variations of the implementation of a magnetostrictive element and of means for applying mechanical constraints to said element to make a magnetic actuator according to the invention.
Figure 5B:
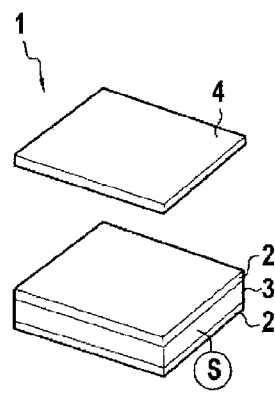
Figure 5C:
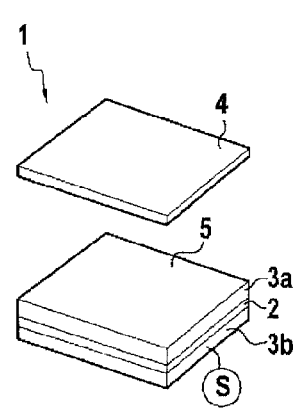

FIGS. 5A through 5C show firstly the different preferred assembly configurations of a magnetic element subjected to stresses to allow the movement of a magnetized mobile and realize a magnetic actuator capable of implementing the method of the invention.

FIG. 5A shows the simplest configuration for making a magnetic actuator 1 according to the invention. A thin layer of amorphous iron-silicon-boron is adhesively bonded to a plate made of a piezoelectric material 3 of the multi-fiber composite or "MFC" type. A magnetized mobile 4, made of neodymium-iron-boron (NdFeB) or samarium-cobalt (SmCo) or iron-platinum or ferrite for example, is placed in close proximity. All of these permanent magnet materials are commercially available materials or known in the state of the art.

The piezoelectric plate 3 is connected to a direct or alternating voltage generator 5. By applying a voltage to said plate 3, said plate will exert a uniaxial mechanical stress on the thin magnetic layer 2, resulting in an orientation of the preferred direction or easy axis of magnetization AF of the layer 2 according to the principles stated previously with reference to FIGS. 1 through 4.

Thus, the magnetic flux of a magnetized mobile 4 set next to or suspended above the assembly made up of the thin layer 2 and the piezoelectric plate 3 therefore has a tendency to be channeled within the layer 2 along the preferred direction corresponding to the orientation of the easy axis AF in said layer, which results in a force or a torque resulting in turn in a rotation or translation motion of the magnet 4 with respect to the assembly of the magnetic layer 2 and the piezoelectric plate 3.

In a more specific case, an anisotropic stress can be applied to the FeSiB layer 2 when the piezoelectric plate 3 used is an MFC type plate that operates in a single direction. In this case, the application of a voltage to the plate 3 by means of a voltage generator 5 causes within the layer 2 a rotation of the preferred magnetization direction in its plane. The permanent magnet placed above said layer 2 then undergoes a torque to align its flux in this new direction, and this results in a rotary motion of the magnet 5 which can then be used.

In a first preferred alternative embodiment shown in FIG. 5B, the magnetic actuator 1 can comprise two FeSiB magnetic layers 2a, 2b deposited on either side of a plate of piezoelectric material 3 sandwiched between the two said layers 2a, 2b. This sandwich configuration makes it possible to avoid bending phenomena of the bimetallic strip or bimorph type which can be encountered when there is an asymmetry of the layers 2, 3 as shown in FIG. 5A. It should be noted that the two magnetic layers 2a, 2b, can serve as electrodes for the piezoelectric plate 3 if they are conductive.

In a second preferred alternative embodiment shown in FIG. 5C, the magnetic actuator 1 can comprise two piezoelectric plates 3a, 3b, set on either side of a magnetic layer 2 sandwiched between said plates 3a, 3b. This configuration allows two stresses independent of one another in value and direction to be applied to the same magnetic layer 2, for example to drive the magnetized mobile 4 in complete 360° rotation in place.

FIGS. 6 through 9 show different embodiments of an linear magnetic actuator according to the invention and constituting a switch 10, 10', 20, 20'. In the description that follows, the common elements of the two actuators of FIGS. 5A through 5C have the same numerical designations.

These different embodiments use the principle of changing the direction and the intensity of the easy magnetization axis of a magnetic layer described in FIG. 1, 2, or 3.

Figure 6:
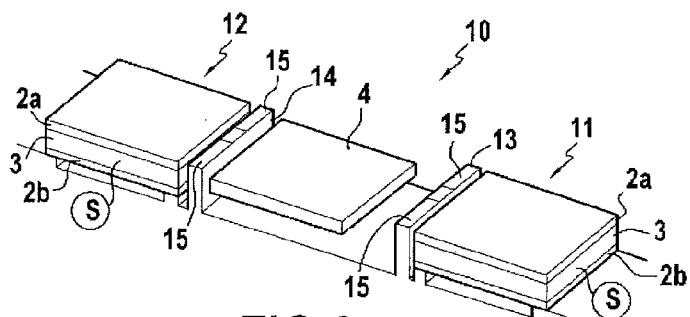
FIG. 6 shows a first example of making a magnetically-actuated switch operating according to the method of the invention.

As shown in FIG. 6, the switch 10 includes in particular a magnetized mobile 4 consisting of a permanent magnet floating in translation between two assemblies 11, 12 each consisting of two FeSiB magnetic layers 2a, 2b deposited on a plate 3 made of a piezoelectric material connected to a voltage generator 5. Inserted between one side of each assembly 11, 12 and the magnetized mobile 4 are two walls 13, 14 designed to limit the extent of the motions of the magnetized mobile 4, so that the layers 2a, 2b of the assemblies 11, 12 do not saturate and also so that the mobile 4 is never out of magnetic reach of said assemblies. The walls 13, 14 are each also covered on their upper edge by a metallic layer suited for establishing electrical contact with the magnetized mobile 4 during movements thereof under the combined attractions of the assemblies 11, 12 when voltage is applied to the latter, by the generators 5 separately and in complementy fashion.

Figure 7:
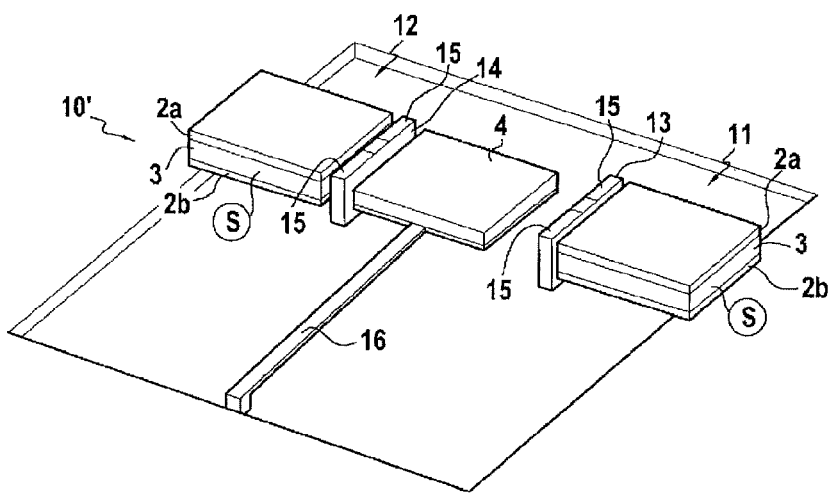
FIG. 7 shows a variation of the implementation of the switch of FIG. 6.

FIG. 7 shows a switch 10' similar to that of FIG. 6, but in which the magnetized mobile 4 is carried on a spring arm 16. This arm 16 adds an additional force supporting the magnetized mobile 4 which, in combination with the magnetic attraction forces exerted on the mobile 4 by the assemblies 11, 12, allows the force moving mobile 4 to be regulated and the motion to be constrained to a linear translation motion between the walls 13, 14 of the switch 10'.

As for the assemblies 11, 12, in this embodiment they can have a structure identical to those proposed in FIG. 6. They are separately controlled, and in complementary fashion.

Figure 8:
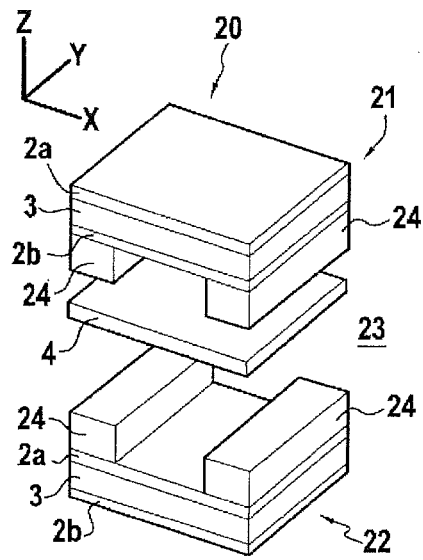
FIGS. 8 and 9 show other embodiments of magnetically-actuated switches according to the invention.
Figure 9:
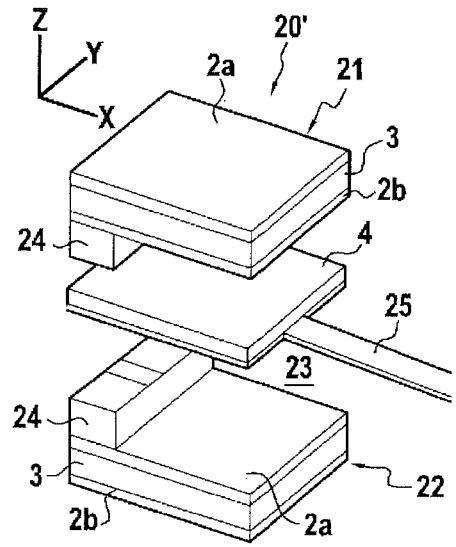

FIGS. 8 and 9 show two other embodiments of a switch 20, 20' respectively, operating according to the magnetic actuation method of the present invention. In these two variations, the switch 20, 20' comprises two actuator assemblies 21,22, each consisting of two layers 2a, 2b of magnetostrictive material between which is inserted a plate of a piezoelectric material 3. The two assemblies 21, 22 thus have a structure similar to that of the assemblies 11, 12 of the switches 10, 10' in FIGS. 5 and 6, and are also controlled separately and in complementary fashion. The two assemblies 21,22 are arranged one above the other and a magnetized mobile 4, consisting of a permanent magnet, is movably arranged for vertical translation in a movement space 23 for mobile 4 provided between the assemblies 21, 22. Analogously to the walls 13, 14 described previously for the variants in FIGS. 6 and 7, contact pads 24, advantageously coated with a metallic conductive layer, are arranged between the assemblies 21, 22 and the mobile 4.

Moreover, the assemblies 21, 22 are each connected to a direct or alternating voltage generator, not shown in the figures, allowing the piezoelectric plate 3 to be driven and a mechanical stress to be applied to the magnetic layers 2a, 2b to cause the movement of the mobile 4 within the space 23.

In the embodiment of FIG. 9, the magnetized mobile 4 is carried on a spring arm 25 while in the variant of FIG. 8 said mobile 4 is held in position purely by the magnetic force.

In the embodiment of FIG. 9, the arm 25 is used to control the mobile 4 in a linear translation motion and also to add a non-magnetic supporting force independent of the magnetic force exerted between mobile 4 and actuator assemblies 21, 22 to control the movement of the mobile 4.

The embodiment of FIG. 8 has the advantage of being a simpler construction, without a guiding and supporting arm for mobile 4, the contact force being simply stronger between the mobile 4 and the contact pads 24.

FIGS. 10 through 14 show other embodiments of magnetic actuators according to the present invention in which the actuation of a magnetized mobile occurs in rotation, according to the principles previously stated with reference to FIGS. 3 and 4.

These magnetic actuators are based on the rotation of the easy magnetization axis AF described in FIGS. 3 and 4.

Figure 10:
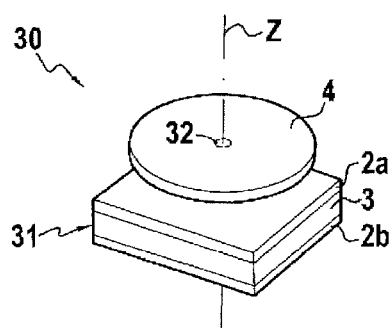
FIGS. 10 and 11 show schematically a rotary actuator or magnetically-driven motor operating according to the method of the invention.

FIG. 10 shows a rotary magnetic actuator 30 the travel whereof is limited to a 90° angular range. This actuator 30 includes an actuating assembly 31 consisting of two magnetic layers 2a, 2b set on either side of a plate 3 consisting of a piezoelectric material fed by a direct or alternating voltage generator, not shown.

A magnetized mobile 4, magnetized in the plane of the assembly 31, is placed above the last-mentioned and confined to rotary motion by a pivot 32. The magnetized mobile 4 induces magnetization in the magnetic layers 2a, 2b. The easy axis of the layers 2a, 2b is controlled by the nature and the intensity of the mechanical stress applied by the piezoelectric plate 3. When the direction of the magnetization induced by the mobile 4 is not parallel to the direction of the easy axis of the layers 2a, 2b, these two directions have a tendency to align themselves: there is then a torque between the magnetized mobile and the actuation assembly 31. It is then possible to use the rotational mobility of the magnetized mobile for the purpose of carrying out rotary actuation functions.

Figure 11:
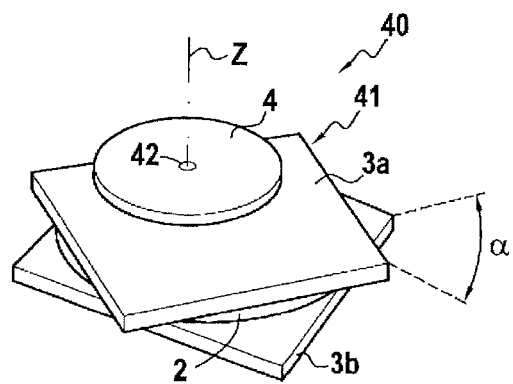

FIG. 11 shows a variation of the magnetic actuator of FIG. 10. This variation shows a rotary actuator 40, comprising a magnetized mobile 4 able to perform a 360° rotation, according to the principles of rotation of the easy magnetization axis of a magnetic material described previously in connection with FIG. 4.

This actuator comprises an actuating assembly 41 comprising two distinct piezoelectric elements 3a, 3b offset at an angle of 45° to one another about a vertical axis Z perpendicular to both of the piezoelectric elements, which apply stresses to a magnetic layer 2 arranged between the two elements 3a, 3b. The mobile 4, magnetized in a direction parallel to the upper plane of the assembly 41, is placed above and confined to rotary motion by a pivot 42.

In order to be able to simultaneously stress the magnetic material layer 2 in two distinct directions and to drive the mobile 4 in rotation, the two piezoelectric elements 3a, 3b are independently connected to direct or alternating voltage generators. The voltage supply to the two piezoelectric elements causes the creation of two distinct stresses which are combined on the magnetic layer 2, and by varying the supply voltage a relative variation of the stresses is effected, which brings about a rotation of the easy magnetization axis of the layer 2, which in turn causes the magnetized mobile 4 to be driven in rotation.

Figure 12:
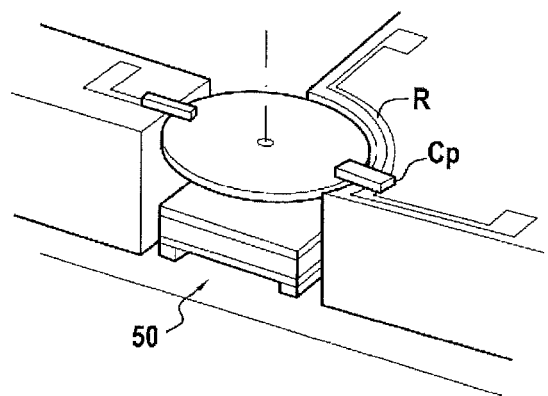
FIGS. 12 through 14 show different configurations of rotary magnetic actuators according to the present invention.
Figure 13:
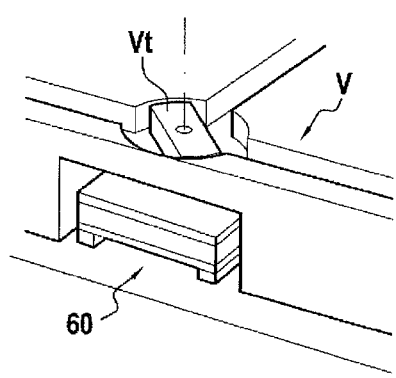
Figure 14:
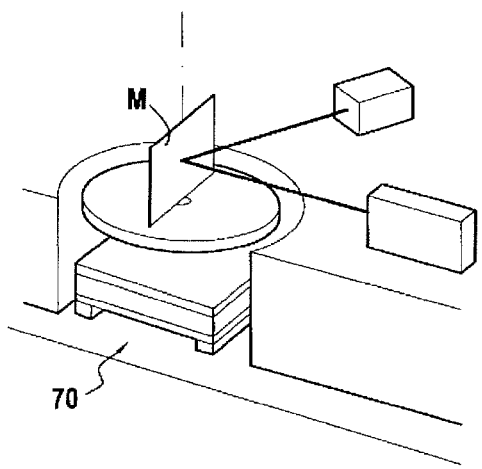

FIGS. 12 through 14 show schematically the use of actuators such as those described and shown in FIGS. 10 and 11 in applications with heat-sensitive components for which static positioning is more important than dynamic motion.

FIG. 12 shows schematically an angular magnetic actuator 50 for controlling the position of a potentiometer. This actuator has a structure identical to that of FIG. 10. A positioning wiper Cp is attached on the magnetized mobile and extends over a resistor R so as to sweep it during motion of the mobile 4 and thus cause variation in said resistance R.

FIG. 13 shows schematically an angular magnetic actuator 60 for controlling the position of a fluidic or biofluidic valve V where the properties of the (often organic) fluids and/or the biological aspect (cells for example) are heat-sensitive. In this example, the magnetized mobile of the actuator, the structure whereof is also identical to that of FIG. 10 or 11, supports a kind of flap Vt for closing the various channels of the valve.

Finally, FIG. 14 shows schematically an angular magnetic actuator 70 for controlling the position of a mirror, diffraction grating or photodetector M. In this example, the actuator again has a structure similar to that of the actuators described in FIG. 10 or 11.

This kind of actuator 70 can be used an an optical switch for optical fiber communications, or as a means of selecting one frequency of light among others for optical filters, for optical fiber communications or for spectroscopic analysis.

Optical quality depends on the flatness of the mirror M, which can change with heat. Moreover, the emission of infrared light by hot elements often prohibits the use of actuators using windings in the infrared field.

In the different variants of magnetic actuators presented, it is also possible to contemplate applying the mechanical stress to the magnetic layer(s) of the actuator by electrostatic or thermal deformation, direct mechanical loading or any other method.

The invention is not limited to the examples described and presented, for various modifications can be made to it without departing from its framework.

The invention claimed is:

1. A magnetic actuation method, according to which a magnetized mobile (4) is steered by means of at least one magnetic element (2, 2a, 2b) set facing said magnetized mobile, wherein the preferred direction (or easy axis) of magnetization is spun throughout said element round by the application of at least one mechanical stress to said magnetic element(s) (2, 2a, 2b), causing an anisotropy within said element and thus driving the magnetized mobile in a preferred rotation or linear direction, wherein the mechanical stress applied is a unidirectional stress resulting from the bidirectional combination of two unidirectional stress preferably applied along two intersecting directions substantially 45° apart.

2. A method according to claim 1, wherein the magnetic element (2, 2a, 2b) consists of a magnetic material chosen among soft magnetostrictive materials, the easy magnetization axis whereof can turn under a mechanical stress.

3. A method according to claim 1, wherein the mechanical stress applied is an oriented, directional or anisotropic stress.

4. A method according to claim 1, wherein the magnetized mobile is held in at least one stable position in the absence of a mechanical stress applied to at least one magnetic element, the stable position(s) being determined by at least one shape anisotropy of said at least one magnetic element.

5. A method according to claim 4, wherein the magnetized mobile is held in several stable positions, regularly spaced from one another, in the absence of a mechanical stress, said stable positions being determined by an identical periodic anisotropy of said at least one magnetic element.

6. A method according to claim 1, wherein the magnetic element consists of at least one thin layer (Cm) or at least one element made of a soft magnetostrictive material, such as the following alloy bases: FeNi, FeCo, FeAl, FeB, FeSiB, FeCoZrNbB, FeCoSmB, FeCoTbB, obtained in amorphous or crystalline form.

7. A method according to claim 6, wherein the magnetic element is deposited on a substrate (3, 3a, 3b), preferably piezoelectric, connected to a direct or alternating voltage generator (5).

8. A method according to claim 7, wherein the substrate is a piezoelectric element (3) of the multi-fiber composite type.

* * * * *